United States Patent
Adusumilli et al.

(10) Patent No.: US 9,805,973 B2
(45) Date of Patent: Oct. 31, 2017

(54) DUAL SILICIDE LINER FLOW FOR ENABLING LOW CONTACT RESISTANCE

(71) Applicant: INTERNATIONAL BUSINESS MACHINES CORPORATION, Armonk, NY (US)

(72) Inventors: Praneet Adusumilli, Albany, NY (US); Veeraraghavan S. Basker, Schenectady, NY (US); Zuoguang Liu, Schenectady, NY (US); Tenko Yamashita, Schenectady, NY (US); Chun-Chen Yeh, Clifton Park, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/928,908

(22) Filed: Oct. 30, 2015

(65) Prior Publication Data

US 2017/0125289 A1    May 4, 2017

(51) Int. Cl.
| | |
|---|---|
| *H01L 21/8238* | (2006.01) |
| *H01L 21/768* | (2006.01) |
| *H01L 27/092* | (2006.01) |
| *H01L 23/535* | (2006.01) |

(52) U.S. Cl.
CPC .. *H01L 21/76846* (2013.01); *H01L 21/76895* (2013.01); *H01L 23/535* (2013.01); *H01L 27/092* (2013.01)

(58) Field of Classification Search
CPC .................. H01L 21/823475; H01L 21/76846
USPC ........................................................ 438/233
See application file for complete search history.

(56) References Cited

U.S. PATENT DOCUMENTS

| | | | |
|---|---|---|---|
| 7,067,368 B1 | 6/2006 | Fang et al. |
| 7,217,647 B2 | 5/2007 | Yang |
| 7,504,287 B2 | 3/2009 | Beyer et al. |
| 7,544,575 B2 | 6/2009 | Adetutu et al. |
| 7,670,915 B1 | 3/2010 | Ryan et al. |
| 8,148,221 B2 | 4/2012 | Lim et al. |
| 8,263,467 B2 | 9/2012 | Grupp et al. |

(Continued)

OTHER PUBLICATIONS

Office Action issues in U.S. Appl. No. 15/157,803 dated Jun. 16, 2017, pp. 1-8.

(Continued)

*Primary Examiner* — Hsin-Yi Hsieh
(74) *Attorney, Agent, or Firm* — Tutunjian & Bitetto, P.C.; Vazken Alexanian

(57) ABSTRACT

A method for fabricating a semiconductor device includes depositing a sacrificial liner in self-aligned contact openings in first and second regions. The openings are filled with a sacrificial material. The second region is blocked with a first mask to remove the sacrificial material from the first region. The first mask is removed from the second region, and the sacrificial liner is removed from the first region. A first liner is formed in the openings of the first region, and first contacts are formed in the first region on the first liner. The first region is blocked with a second mask to remove the sacrificial material from the second region. The second mask is removed from the first region, and the sacrificial liner is removed from the second region. A second liner is formed in the openings of the second region, and second contacts are formed in the second region.

16 Claims, 12 Drawing Sheets

(56) References Cited

U.S. PATENT DOCUMENTS

| | | | |
|---|---|---|---|
| 8,617,955 | B2 | 12/2013 | Waite et al. |
| 8,796,099 | B2 | 8/2014 | Alptekin et al. |
| 8,927,407 | B2 | 1/2015 | Baars et al. |
| 8,987,126 | B2 | 3/2015 | Choi et al. |
| 9,397,003 | B1 * | 7/2016 | Niimi .............. H01L 21/823418 |
| 9,478,468 | B1 * | 10/2016 | Cheng ............... H01L 21/82387 |
| 2007/0080408 | A1 | 4/2007 | Absil et al. |
| 2014/0248761 | A1 | 9/2014 | Park et al. |
| 2015/0091093 | A1 | 4/2015 | Bouche et al. |

OTHER PUBLICATIONS

Office action issued in U.S. Appl. No. 15/287,611 dated Jun. 26, 2017.

* cited by examiner

DUAL SILICIDE LINER FLOW FOR ENABLING LOW CONTACT RESISTANCE

BACKGROUND

Technical Field

The present invention relates to semiconductor processing, and more particularly to methods and devices for a dual liner with improved contact resistance and reduced pinch off.

Description of the Related Art

In complementary metal oxide semiconductor processing (CMOS), n-type and p-type devices are formed together. These devices may share processing steps at certain points in a workflow but need to be processed separately in others. One process where the n-type and p-type devices are processed separately includes dual liner integration for forming liners for self-aligned contact (SAC) formation.

A first liner for n-type field effect transistors (NFETs) is applied over both NFETs and p-type field effect transistors (PFETs). The first liner is then removed from the PFETs followed by a second liner over the PFETs and the NFETs. With shrinking contact size, the NFET gets pinched off due to the presence of both liners. Pinched off means that the contact hole gets blocked preventing the contact hole from being filled with contact material. This also increases contact resistance and could result in device failure.

SUMMARY

A method for fabricating a semiconductor device includes depositing a sacrificial liner in self-aligned contact openings in first and second regions, where the first region includes a first device type and the second region includes a second device type. The openings are filled with a sacrificial material. The second region is blocked with a first mask to remove the sacrificial material from the first region. The first mask is removed from the second region, and the sacrificial liner is removed from the first region. A first liner is formed in the openings of the first region, and first contacts are formed in the first region on the first liner. The first region is blocked with a second mask to remove the sacrificial material from the second region. The second mask is removed from the first region, and the sacrificial liner is removed from the second region. A second liner is formed in the openings of the second region, and second contacts are formed in the second region.

Another method for fabricating a semiconductor device includes patterning an interlevel dielectric layer to form self-aligned contact openings over field effect transistors; depositing a sacrificial liner in the self-aligned contact openings; filling the self-aligned contact openings with a sacrificial material; blocking a p-type field effect transistor (PFET) region with a first mask to remove the sacrificial material from an n-type field effect transistor (NFET) region; removing the first mask from the PFET region and the sacrificial liner from the NFET region; forming a first liner in the self-aligned contact openings of the NFET region, which contacts underlying regions; forming first contacts in the NFET region on the first liner; blocking the NFET region with a second mask to remove the sacrificial material from the PFET region; removing the second mask from the NFET region and the sacrificial liner from the PFET region; forming a second liner in the openings of the PFET region, which contacts underlying regions; and forming second contacts in the PFET region.

A semiconductor device includes a first region including n-type field effect transistors (NFETs), and a second region including p-type field effect transistors (PFETs). A first liner is formed in the self-aligned contact openings of the NFETs, and first contacts are formed in the self-aligned contact openings of the NFETs on the first liner. A second liner is formed in the self-aligned contact openings of the PFETs, and second contacts are formed in the self-aligned contact openings of the PFETs on the second liner. The self-aligned contact openings include only one liner in the first region and only one liner in the second region, and the first liner and the second liner include different materials.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The disclosure will provide details in the following description of preferred embodiments with reference to the following figures wherein.

DETAILED DESCRIPTION

Figure 1:
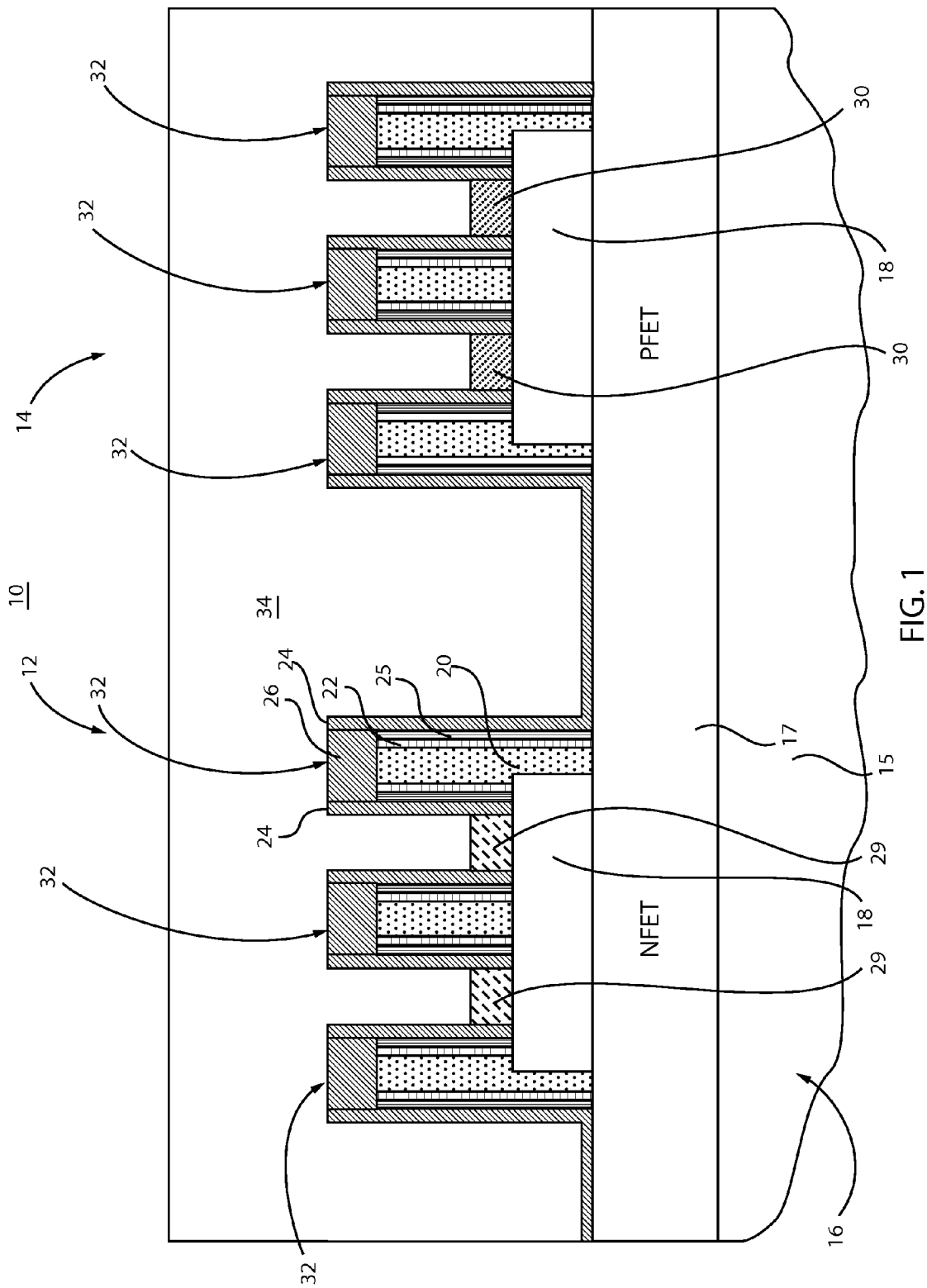
FIG. 1 is a cross-sectional view of a semiconductor device having n-type field effect transistors (NFETs) and p-type field effect transistors (PFETs) formed thereon in accordance with the present principles.

In accordance with the present principles, devices and methods for forming these devices are described that provide flexibility in integrating n-type and p-type devices. In one useful embodiment, formation of dual epitaxial growth or dual epi is enabled by the process flow. In one embodiment, a sacrificial material or mask (e.g., TiN) is formed and used in combination with a sacrificial liner, e.g., an oxide. The sacrificial material and liner are deposited in contact openings or holes so as to not allow metals to touch epitaxially grown materials in regions located within the holes. The regions may include silicided junctions, source and drain regions, trench silicide contacts, etc.

The sacrificial material is employed to remove the liner selectively while covering a device not being processed (one of n-type field effect transistors (NFETs) or p-type field effect transistors (PFETs)). The sacrificial liner may be removed during actual metal pre-clean processing. This sacrificial liner ensures no interface mixing prior to actual silicide liner deposition. A first FET is covered with the sacrificial material during this process. Contacts are formed by depositing conductive material and planarizing the conductive material. The process is repeated to form a liner and contacts in a second FET structure. In some embodiments, contacts are formed by depositing conductive material and planarizing the conductive material in separate processes for the NFETs and the PFETs. This provides the possibility of using different contact materials for NFETs and PFETs.

It is to be understood that the present invention will be described in terms of a given illustrative architecture; however, other architectures, structures, substrate materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The present embodiments may include a design for an integrated circuit chip, which may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., NiPtSi, NiSi, PtSi, etc. These compounds include different proportions of the elements within the compound. In addition, other elements may be included in the compound and still function in accordance with the present principles. The compounds with additional elements will be referred to herein as alloys.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Referring now to the drawings in which like numerals represent the same or similar elements and initially to FIG. 1, a cross-sectional view of a semiconductor device 10 is shown in accordance with the present principles. The device 10 includes a substrate 16, which may include a bulk substrate 15 having a dielectric layer 17 formed thereon, or the substrate 15, the dielectric layer 17 and a semiconductor layer to form fins 18 may be part of a semiconductor-on-insulator (SOI) substrate 16. The substrate 15 may include any suitable material, and in particular, may include Si, Ge, SiGe, SiC, III-V material, etc. The fins 18 may include any suitable semiconductor material, and in particular may include Si, Ge, SiGe, etc. The dielectric layer 17 may include an oxide, although other dielectric materials may be employed.

The fins 18 form channel regions for field effect transistors (FETs) formed thereon. The device 10 may include n-type FETs (NFETs) formed in an NFET region 12 and p-type FETs (PFETs) formed in a PFET region 14. Gate structures 32 are formed over the fins 18 and may include gate conductors 20, 22. A gate dielectric 25 which may cover sidewalls of the gate conductor 22 and is placed between the gate conductors 20, 22 and the fin 18. The gate conductor 20 may include a work function metal, such as e.g., Pt, Ag, etc. and the gate conductor 22 may include a main conductor, e.g., W, etc. The gate structures 32 include spacers 24 and a cap 26, which may include silicon nitride material.

Between gates 32 in the NFET region 12, silicided junctions, source and drain regions, or trench silicide contacts 29 (hereinafter referred to as regions 29) are formed (depending on the design). Between gates 32 in the PFET region 14, silicided junctions, source and drain regions, or trench silicide contacts 30 (hereinafter referred to as regions 30) are formed (depending on the design). The regions 29 and 30 may be formed by epitaxial growth and may be doped in-situ. The regions 29 and 30 may include different materials, e.g., the NFET may include TiSi, while the PFET may include PtSi, NiSi, or NiPtSi. Regions 29, 30 may have been processed already or may be processed in later steps.

A dielectric layer 34, e.g., an interlevel dielectric (ILD), is formed over the NFET region 12 and the PFET region 14. The dielectric layer 34 may include an oxide, although other dielectric materials may be employed.

Figure 2:
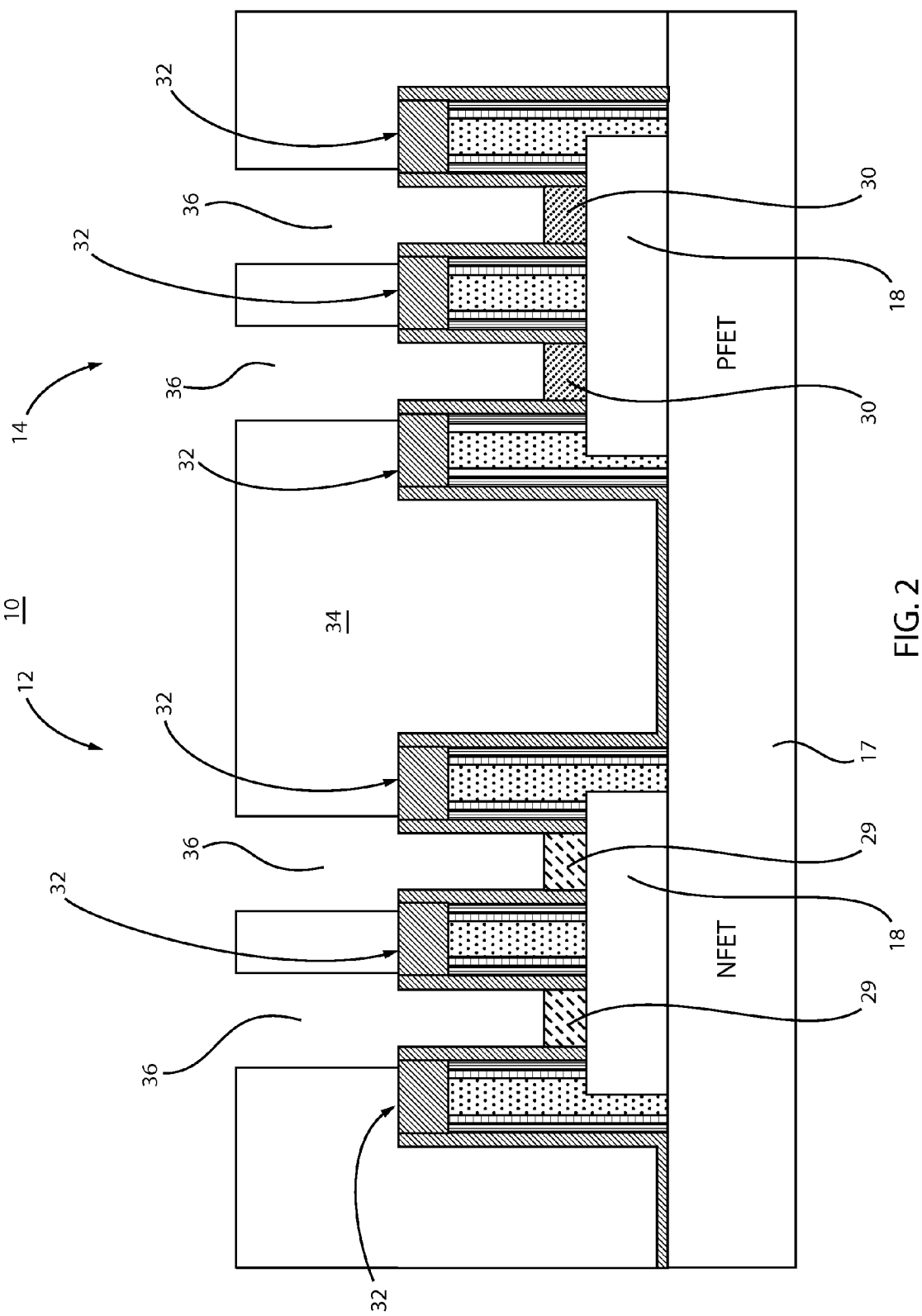
FIG. 2 is a cross-sectional view of the semiconductor device of FIG. 1 having self-aligned contact openings formed for NFETs and PFETs in accordance with the present principles.

Referring to FIG. 2, the dielectric layer 34 is patterned to form openings 36 down to the regions 29 and 30. The openings 36 are formed by a reactive ion etch process in accordance with a lithographically formed mask (not shown).

Figure 3:
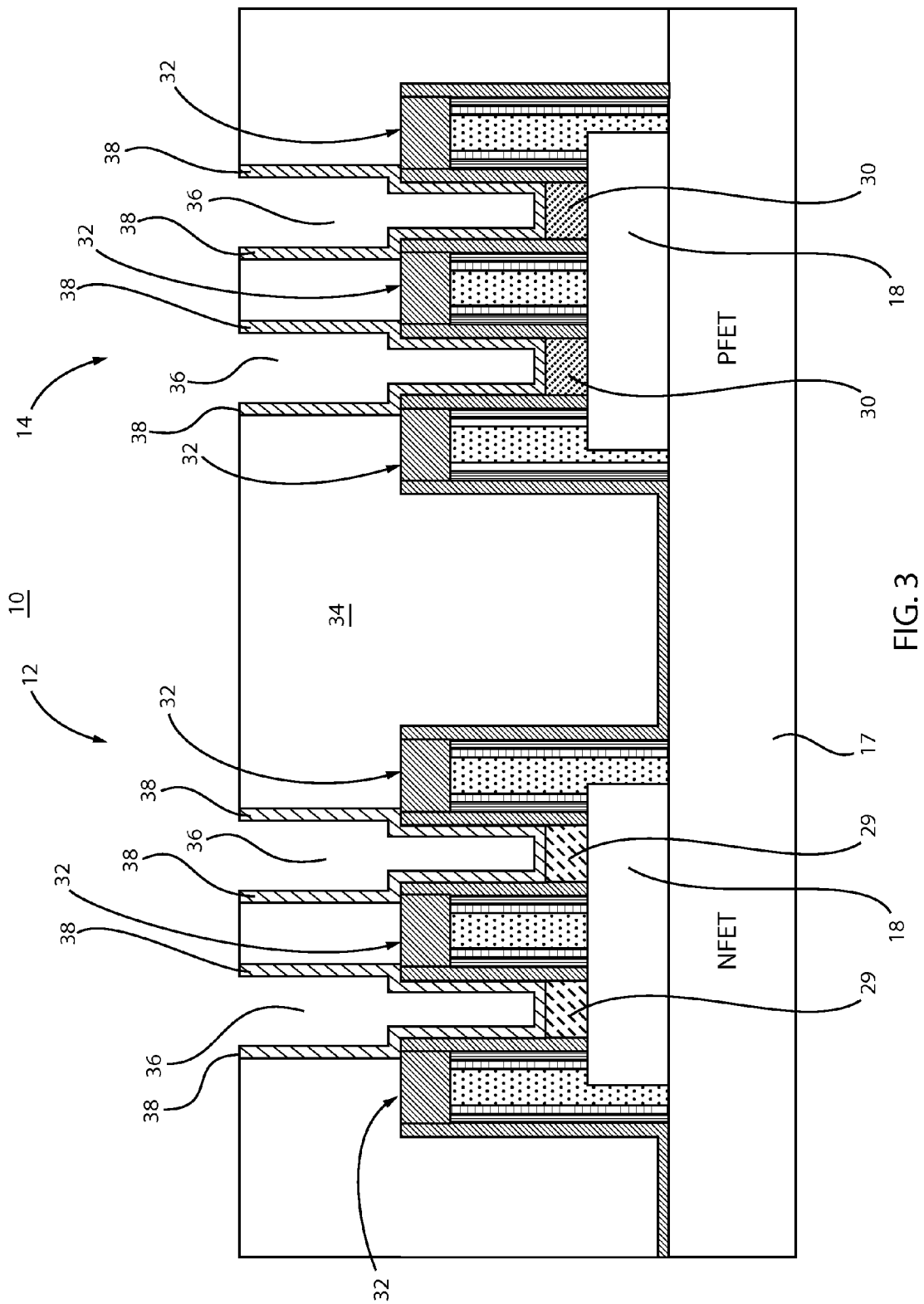
FIG. 3 is a cross-sectional view of the semiconductor device of FIG. 2 having the self-aligned contact openings lined with a sacrificial liner in accordance with the present principles.

Referring to FIG. 3, a sacrificial liner 38 is formed in the openings 36 in both the NFET region 12 and the PFET region 14. The sacrificial liner 38 lines the openings and exposes portions of the regions 29, 30. The sacrificial liner 38 protects the surface (silicide) of the regions 29, 30 from being contaminated with any material. The sacrificial liner 38 may include an oxide material.

Figure 4:
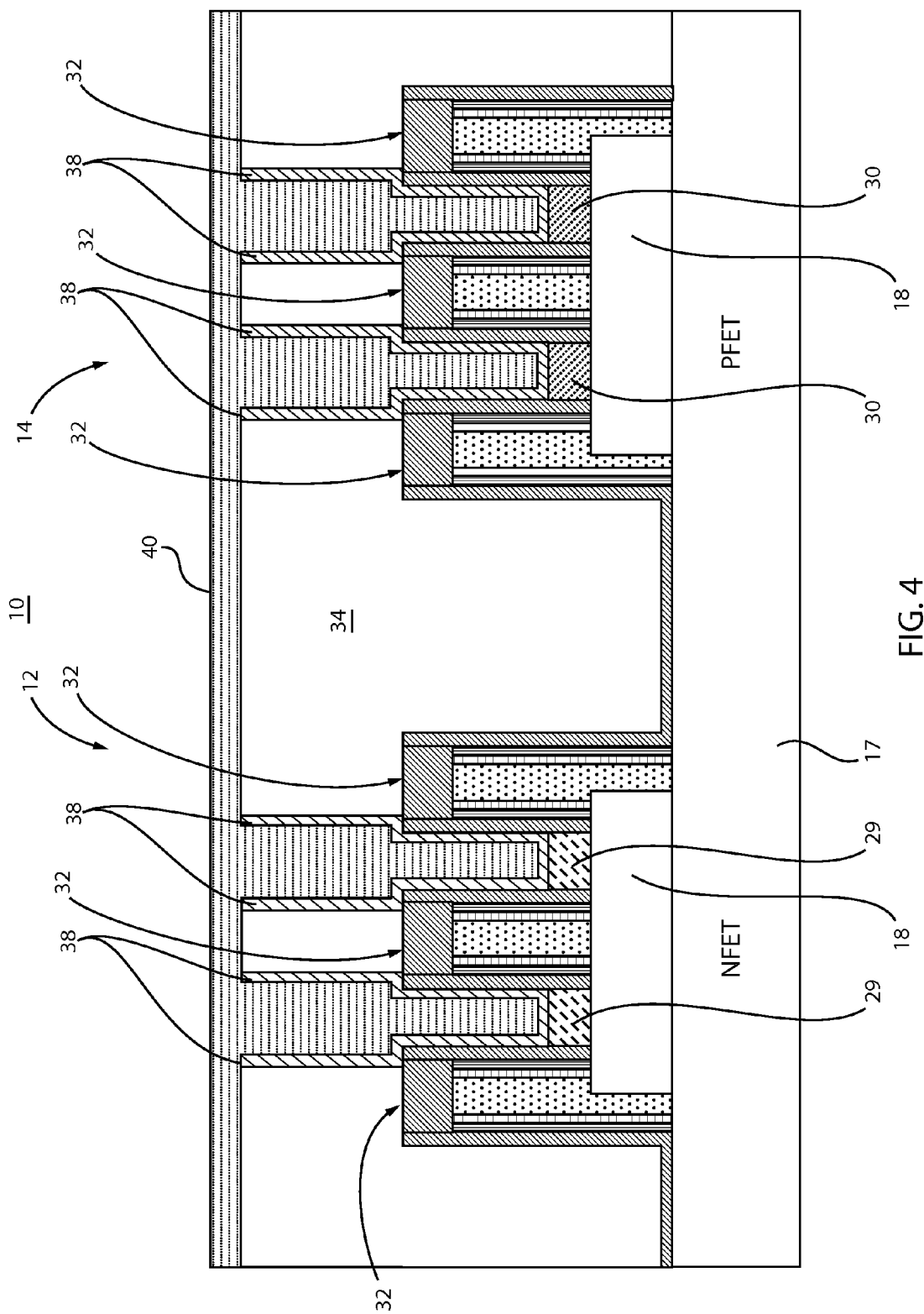
FIG. 4 is a cross-sectional view of the semiconductor device of FIG. 3 having the self-aligned contact openings filled with a sacrificial material in accordance with the present principles.

Referring to FIG. 4, a sacrificial material 40 is deposited in the openings 36 on the sacrificial liner 38 and on a top surface of the device 10 in both the NFET region 12 and the PFET region 14. The sacrificial material 40 is selected to be easily removed by standard cleaning or etching processes, such as standard clean 1 (SC1). In one embodiment, the sacrificial material 40 includes TiN although of materials may be employed.

Figure 5:
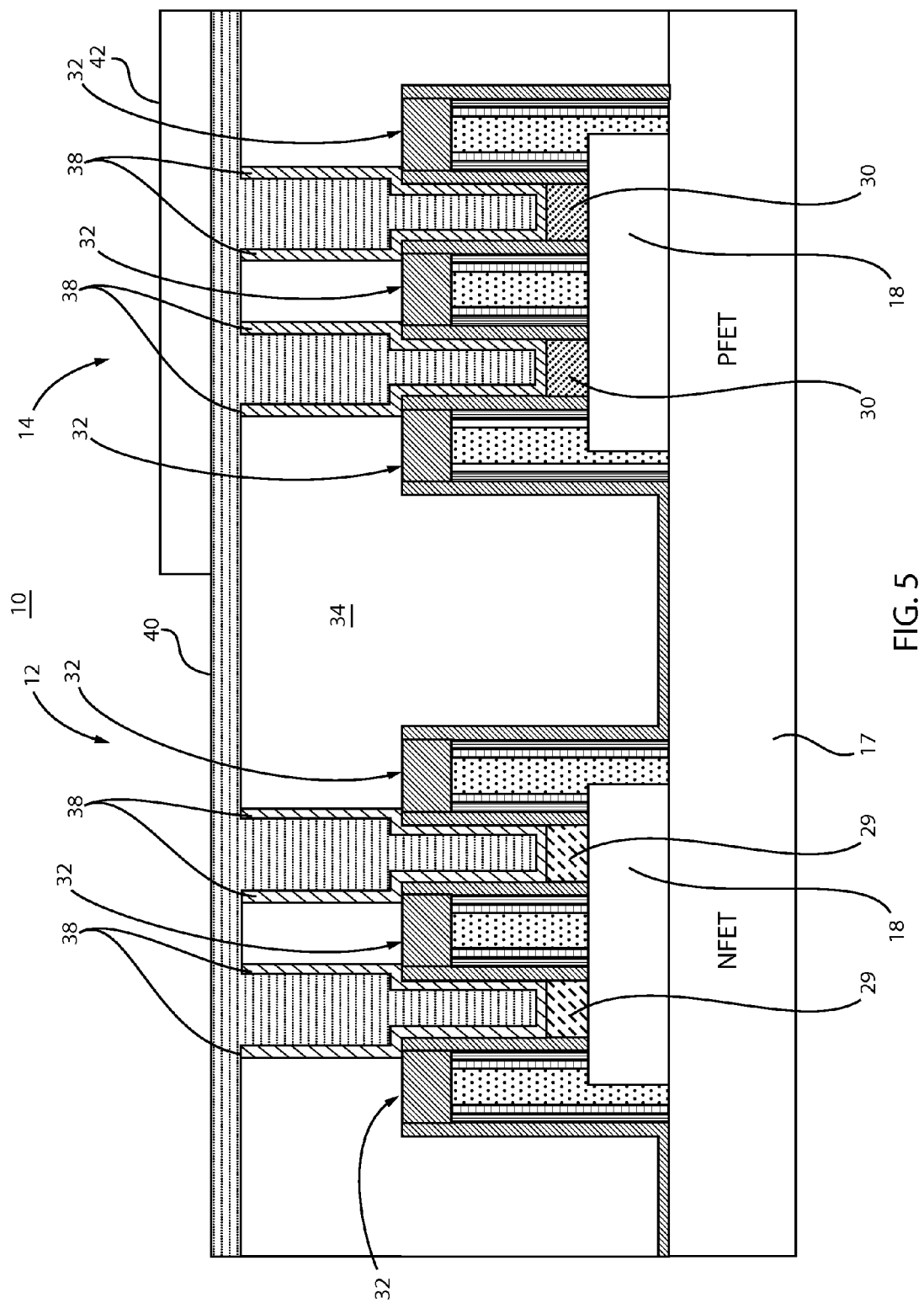
FIG. 5 is a cross-sectional view of the semiconductor device of FIG. 4 having a PFET region blocked with a block mask in accordance with the present principles.

Referring to FIG. 5, a blocking mask 42 is deposited over the sacrificial material 40 in both the NFET region 12 and the PFET region 14. The blocking mask 42 is then patterned (e.g., using lithographic processing) to remove the blocking mask 42 from the NFET region 12. The blocking mask 42 may include a dielectric material, a resist material or any other suitable material configured to withstand processing in the NFET region 12.

Figure 6:
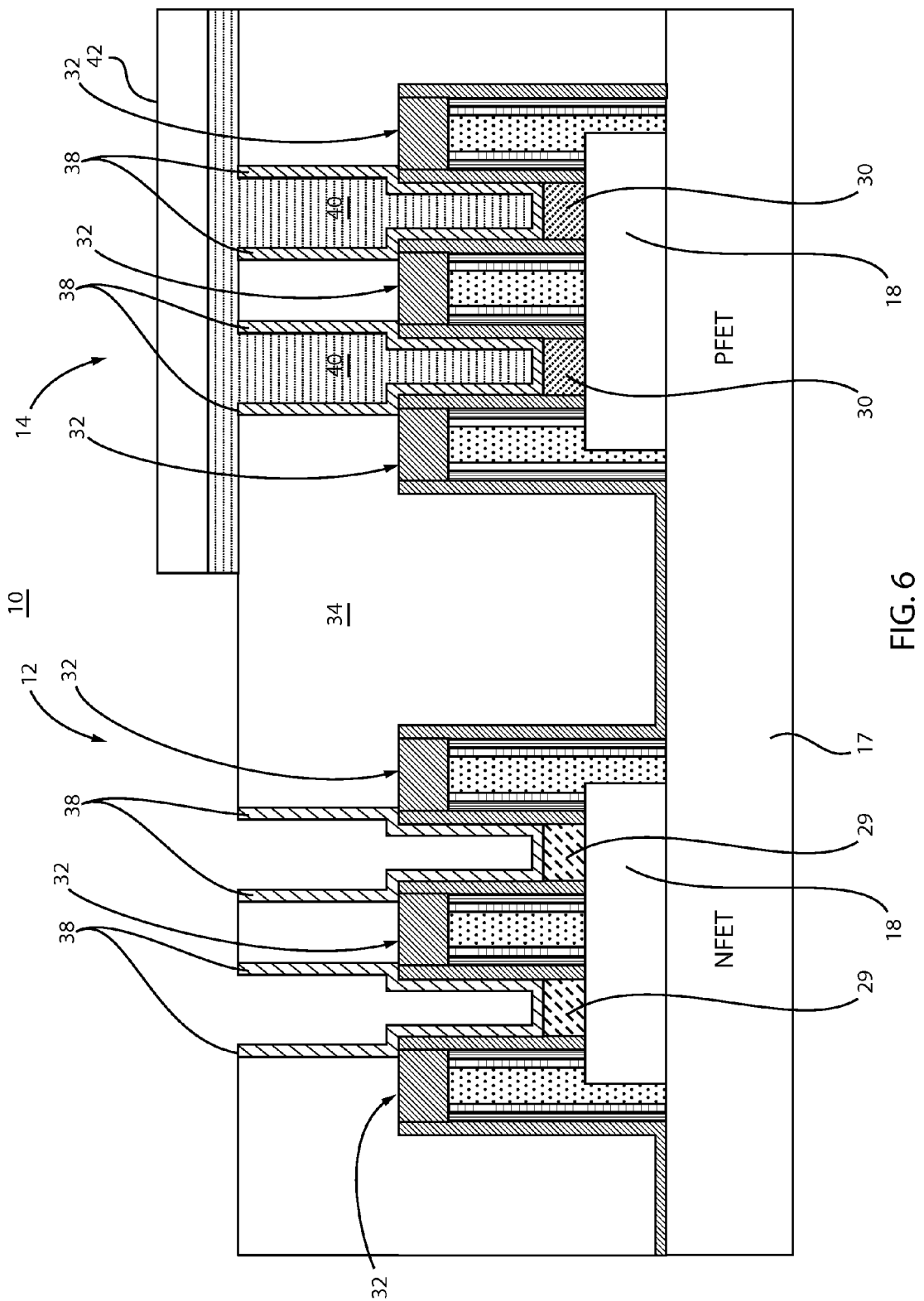
FIG. 6 is a cross-sectional view of the semiconductor device of FIG. 5 having the sacrificial material removed from the NFET region in accordance with the present principles.

Referring to FIG. 6, the exposed NFET region 12 is subjected to an etch process, such as a SC1 process or a different etch process to remove the sacrificial material 40. Once the sacrificial material 40 is removed normal NFET processing may take place while the PFET region 14 is blocked. The NFET region 12 may be processed at this point by performing NFET epitaxial deposition and/or silicide formation. Growth/deposition of trench epitaxial material or deposition of NFET silicide metal or both may occur or other processing may be performed depending on the design.

Figure 7:
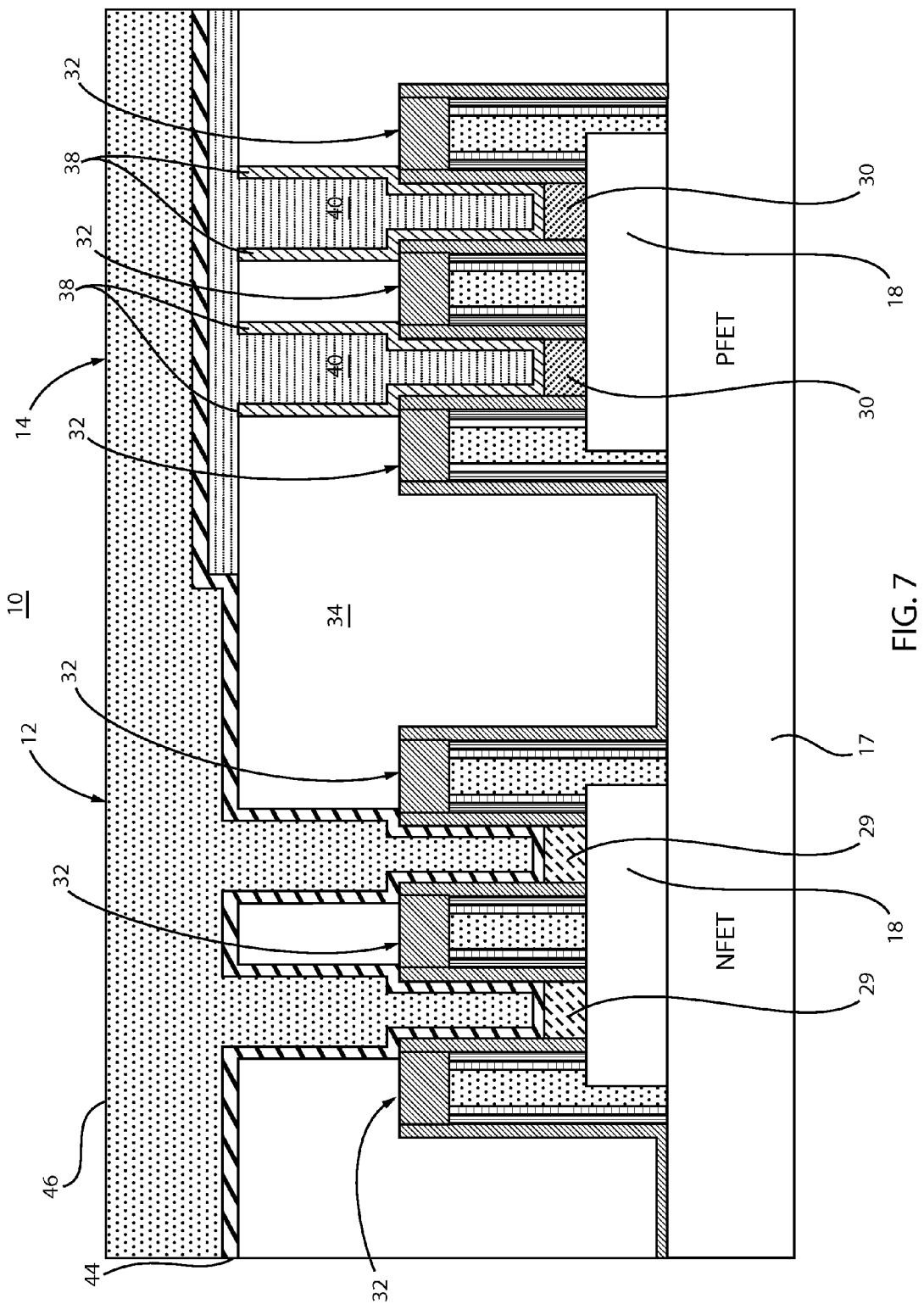
FIG. 7 is a cross-sectional view of the semiconductor device of FIG. 6 having a liner and a main conductor formed in the self-aligned contact holes in the NFET region in accordance with the present principles.

Referring to FIG. 7, the blocking mask 42 is selectively removed from the PFET region 14. A metal preclean process is performed, which removes sacrificial liner 38 from the NFET region 12. The preclean process may include, e.g., a gas cluster ion beam (GCIB) process or SiCoNi™ etch process. After removing the sacrificial liner 38 from the NFET region 12, a liner silicide 44 is formed in the openings 36 (FIG. 3) and over the sacrificial material 40 in the PFET region 14. The liner silicide 44 may include Ti, TiN, or other materials suitable for formation of a low contact resistance connection with regions 29. The silicide liner 44 is followed by a main conductor deposition, which deposits a conductive material 46 over the silicide liner 44. The conductive material 46 may include W, although other conductive materials may be employed.

Figure 8:
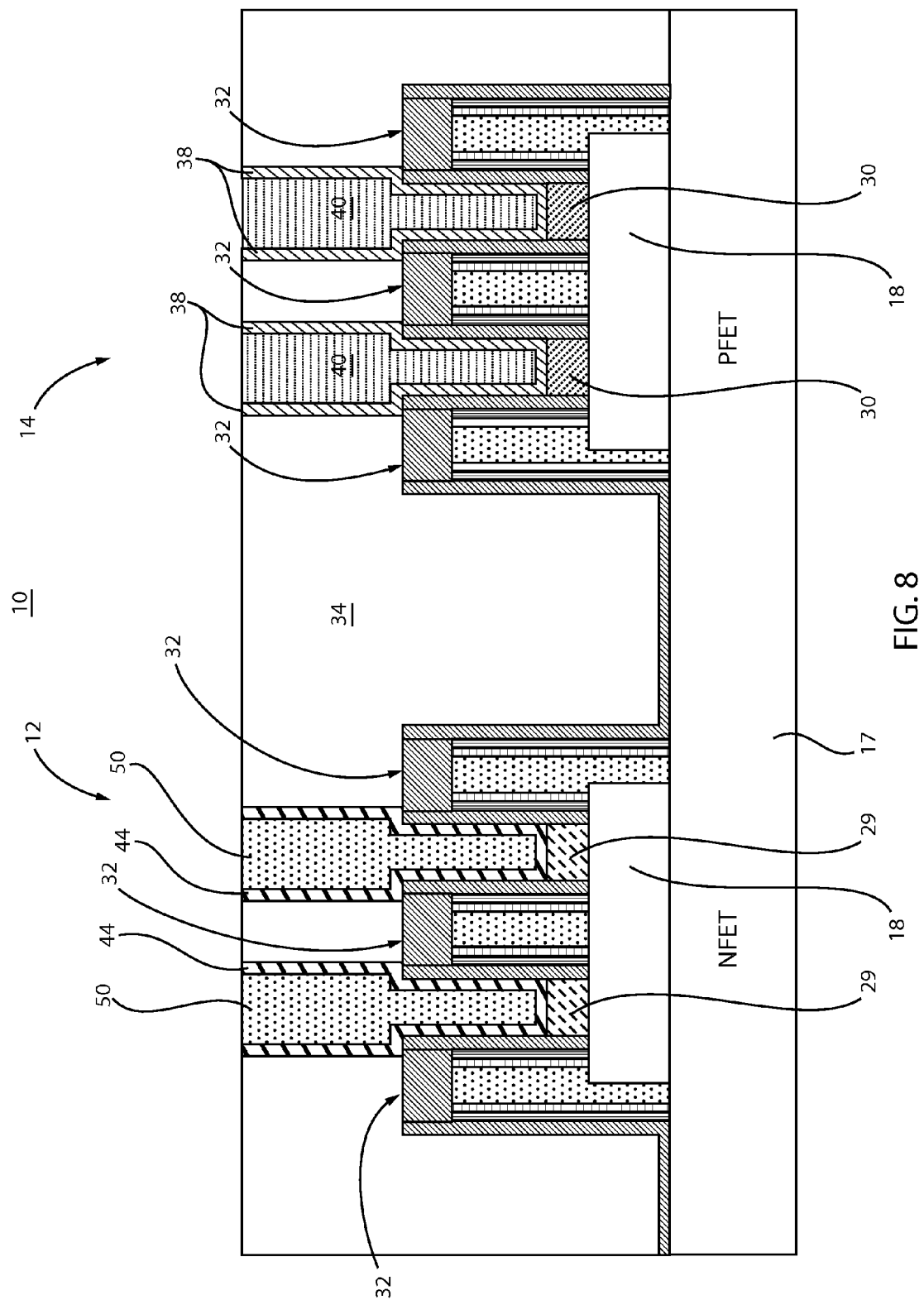
FIG. 8 is a cross-sectional view of the semiconductor device of FIG. 7 having a top surface planarized to form contacts in the NFET region in accordance with the present principles.

Referring to FIG. 8, a planarization process is performed to reduce a top surface down to the ILD 34. The planarization process may include a recess etch or a chemical mechanical polish (CMP). The planarization process forms contacts 50 (e.g., self-aligned contacts (SAC)) for the NFETs in the NFET region 12.

Figure 9:
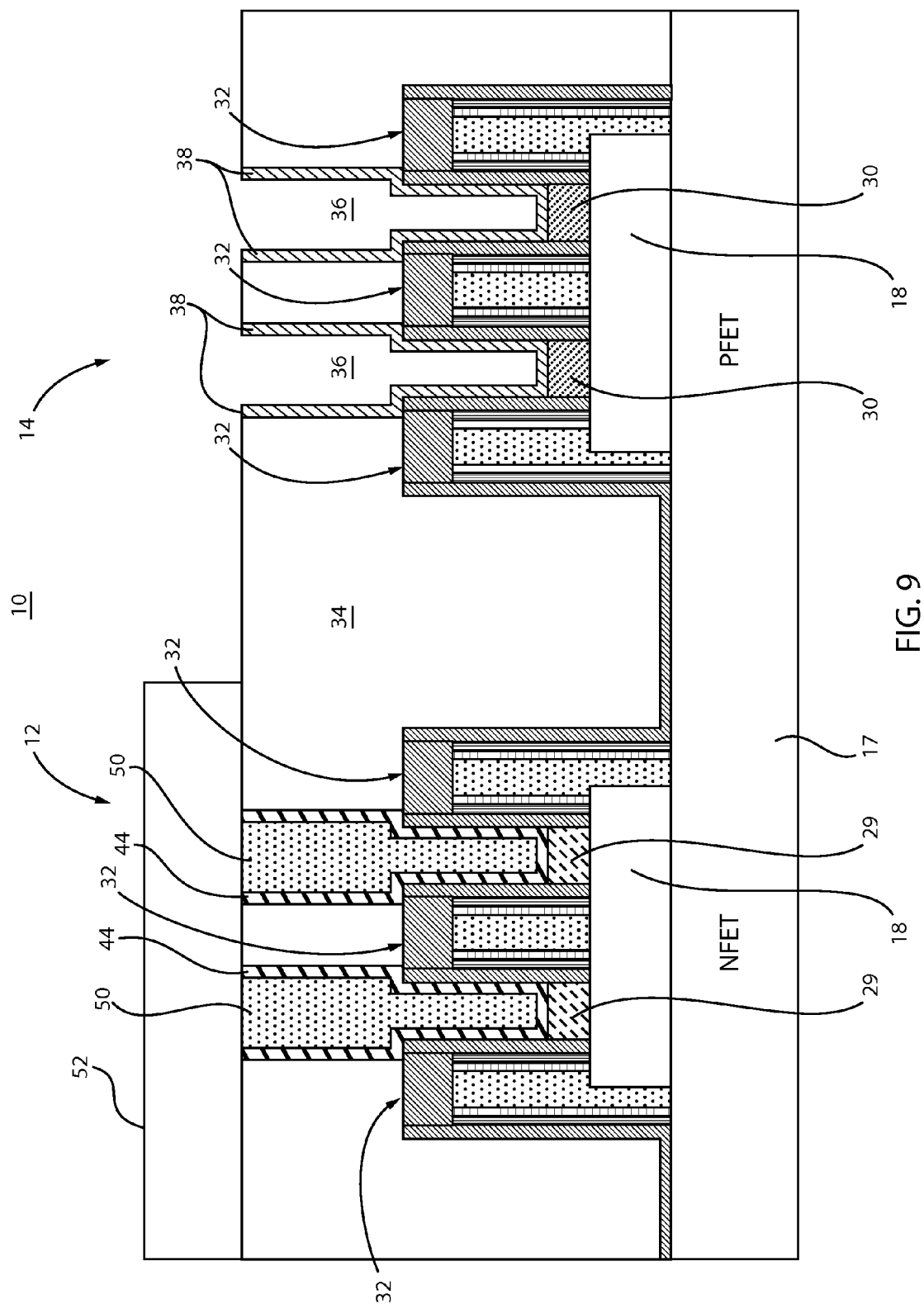
FIG. 9 is a cross-sectional view of the semiconductor device of FIG. 8 having a PFET region blocked with a block mask and the sacrificial material removed from the PFET region in accordance with the present principles.

Referring to FIG. 9, a blocking mask 52 is deposited over the device 10 in both the NFET region 12 and the PFET region 14. The blocking mask 52 is then patterned (e.g., using lithographic processing) to remove the blocking mask 52 from the PFET region 14. The blocking mask 52 may include a dielectric material, a resist material or any other suitable material configured to withstand processing in the PFET region 14.

The exposed PFET region 14 is subjected to an etch process, such as a SC1 process or a different etch process to remove the sacrificial material 40 from openings 36. Once the sacrificial material 40 is removed normal PFET processing may take place while the NFET region 12 is blocked. The PFET region 14 may be processed at this point by performing PFET epitaxial deposition and/or silicide formation. Growth/deposition of trench epitaxial material or deposition of PFET silicide metal or both may occur or other processing may be performed depending on the design.

Figure 10:
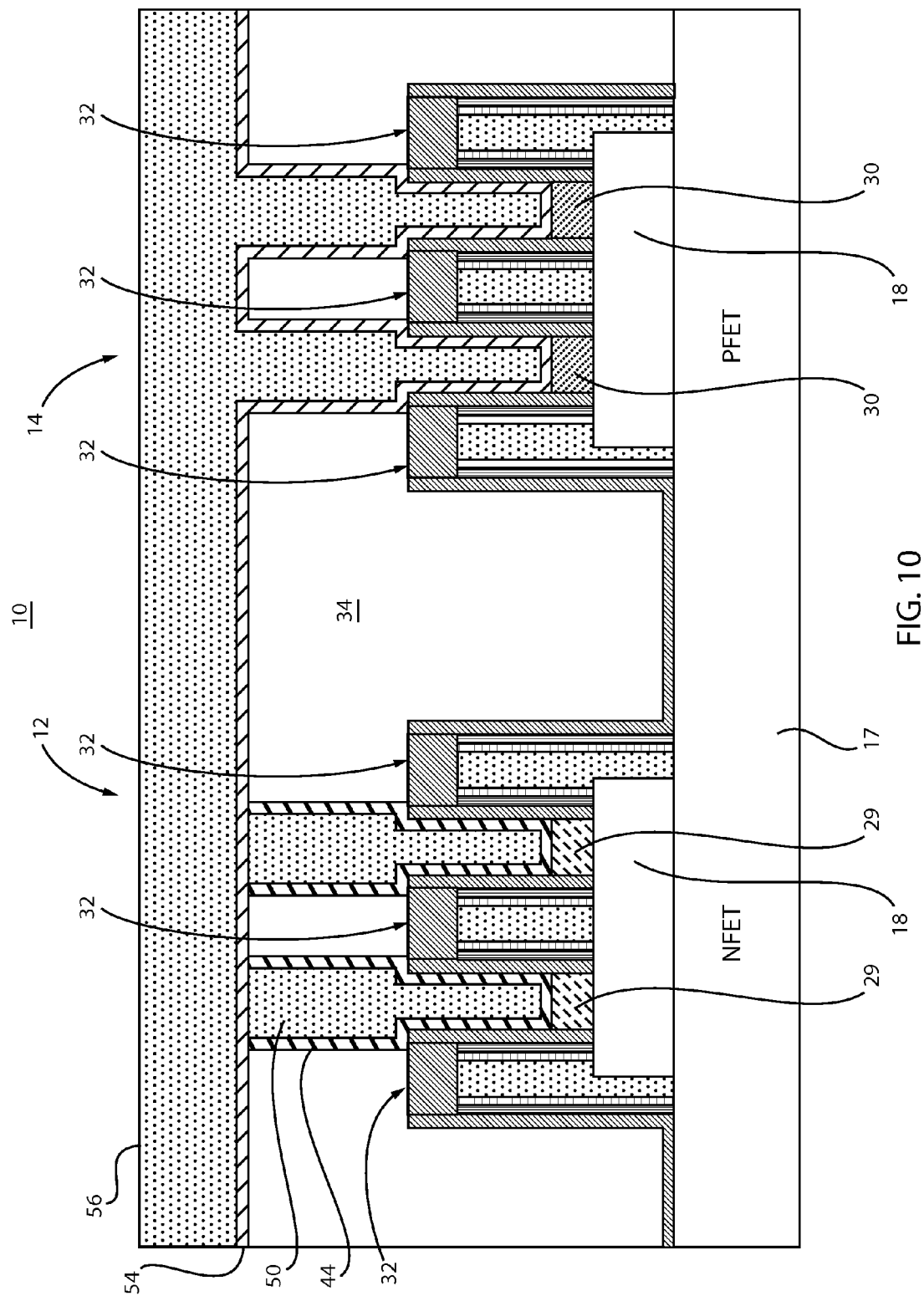
FIG. 10 is a cross-sectional view of the semiconductor device of FIG. 9 having a liner and a main conductor formed in the self-aligned contact holes in the PFET region in accordance with the present principles.

Referring to FIG. 10, the blocking mask 52 is selectively removed from the NFET region 12. A metal preclean process is performed, which removes sacrificial liner 38 from the PFET region 14. The preclean process may include, e.g., a gas cluster ion beam (GCIB) process or SiCoNi™ etch process. After removing the sacrificial liner 38 from the PFET region 14, a liner material 54 is formed in the openings 36 (FIG. 3) and over the contacts 50 in the NFET region 12. The liner material 44 may include Ni, NiPt, Pt, or other materials suitable for formation of a low contact resistance connection with regions 30. The liner material 54 is followed by a main conductor deposition, which deposits a conductive material 56 over the liner material 54. The conductive material 56 may include W, although other conductive materials may be employed. In one embodiment, the materials 46 and 56 may be the same material (e.g., W). In other embodiments, the materials 46 and 56 may include different materials (e.g., Ti, W, TiC, Al, Ag, Pt, etc.).

Figure 11:
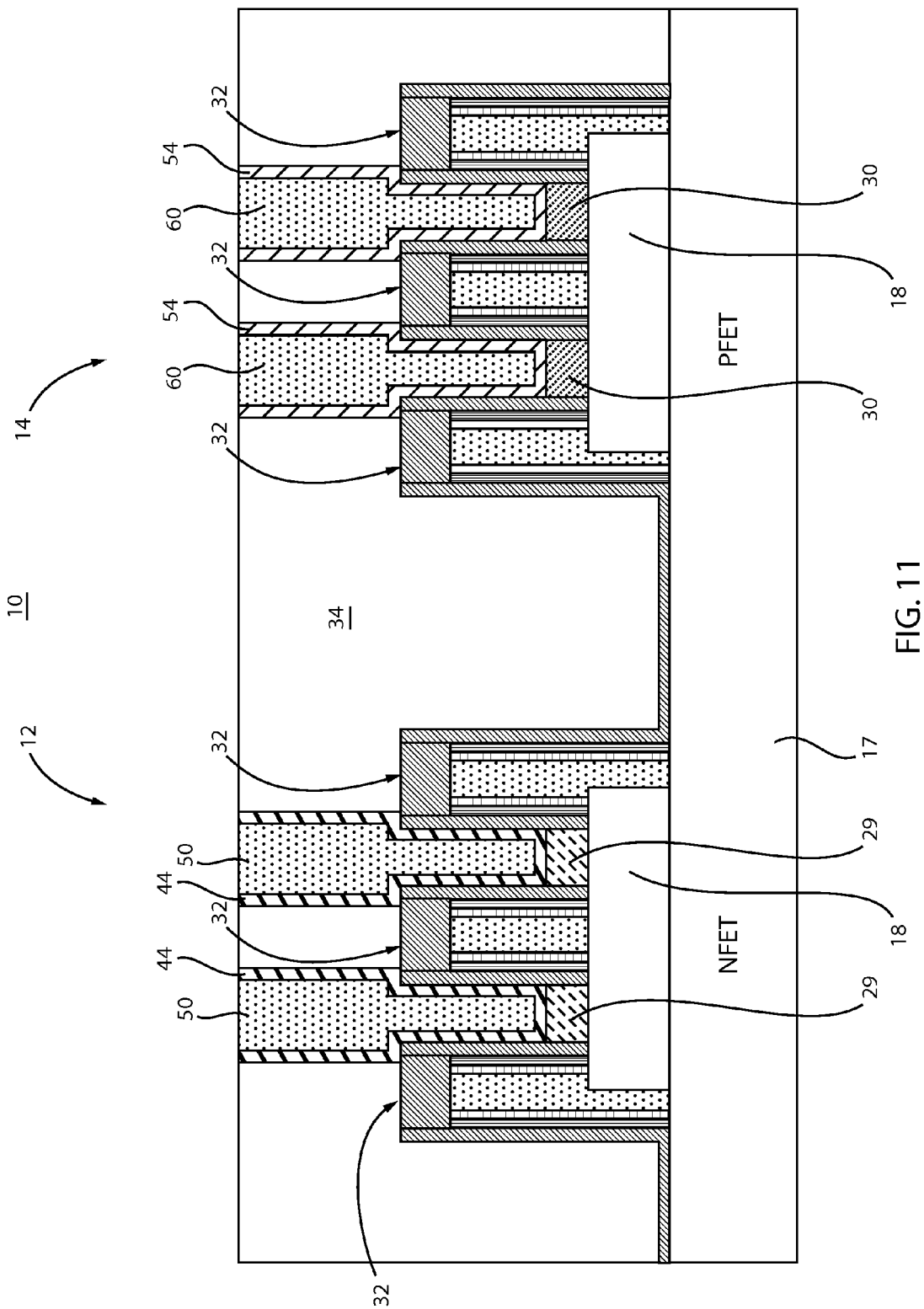
FIG. 11 is a cross-sectional view of the semiconductor device of FIG. 10 having a top surface planarized to form contacts in the PFET region in accordance with the present principles.

Referring to FIG. 11, a planarization process is performed to reduce a top surface down to the ILD 34. The planarization process may include a recess etch or a chemical mechanical polish (CMP). The planarization process forms contacts 60 (e.g., self-aligned contacts (SAC)) for the PFETs in the PFET region 14.

The structure provided in FIG. 11 includes dual liner materials 44, 54 formed separately for NFETs and PFETs. Since the liners 44 and 54 are formed separately, they can be thinner and prevent pinch off for the formation of the main conductor (e.g., conductors 46, 56). With shrinking contact size, thin liners on each type of contact 50, 60 ensures more room for the main conductor (lower resistance). In addition, only one liner is employed in any trench, hence preventing buildup of materials that could result in pinch off, lower contact resistance and possibly device failure.

Figure 12:
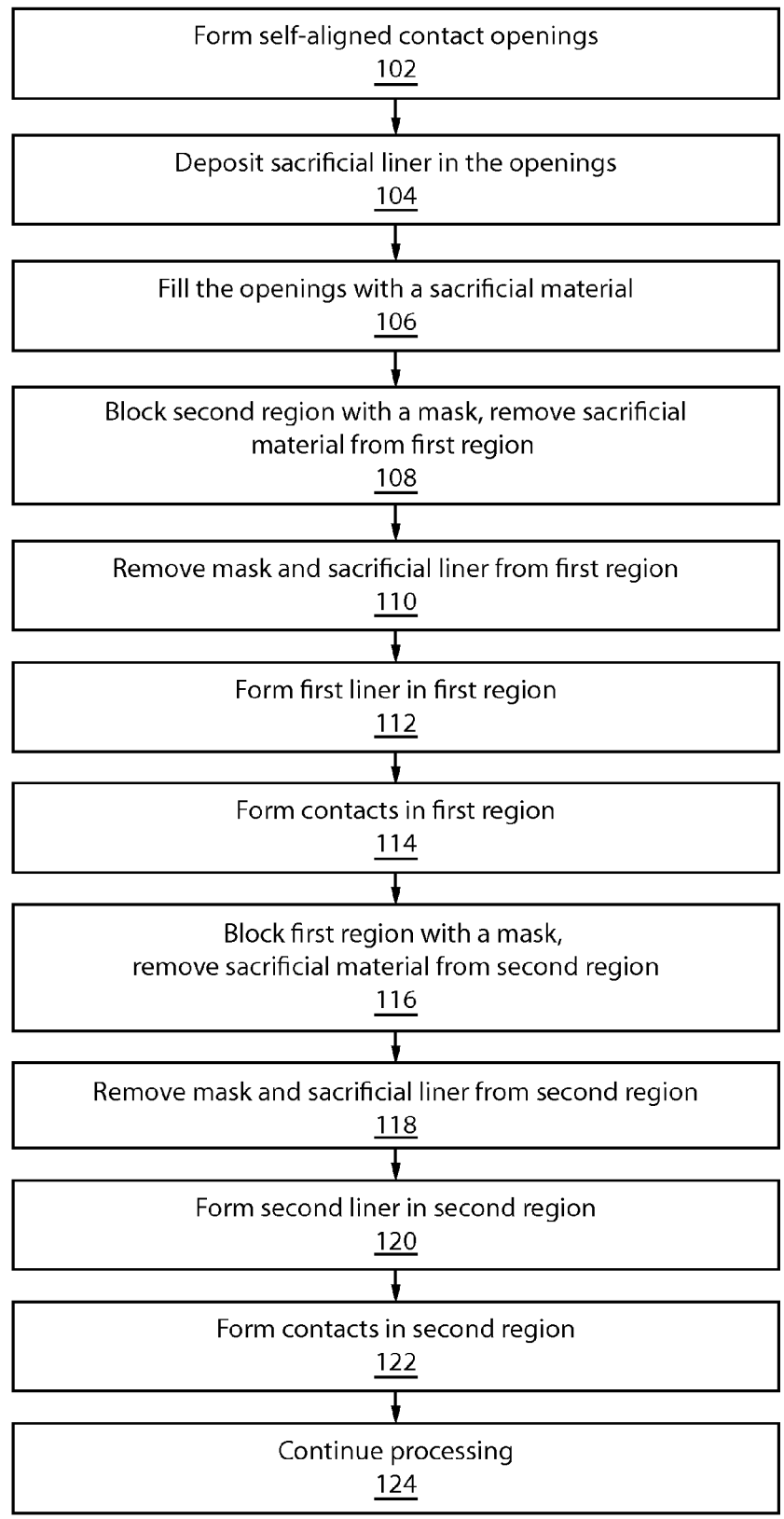
FIG. 12 is a block/flow diagram showing methods for forming a semiconductor device in accordance with illustrative embodiments.

Referring to FIG. 12, methods for fabricating a semiconductor device are shown in accordance with the present principles. In some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

In block 102, self-aligned contact openings are formed by patterning an interlevel dielectric layer. In block 104, a sacrificial liner is deposited in self-aligned contact openings in first and second regions, where the first region includes a first device type (e.g., NFET) and the second region includes a second device type (e.g., PFET). It should be understood that while the present disclosure describes processing the NFET region first; however, the processing order may be reversed so that the PFET region is processed first. Underlying regions in the self-aligned contact openings remain uncontaminated by employing the sacrificial liner for protection. The sacrificial liner may include an oxide.

In block 106, the self-aligned contact openings are filled with a sacrificial material, e.g., TiN. In block 108, the second region is blocked with a first mask to remove the sacrificial material from the first region. In block 110, the first mask is removed from the second region, and the sacrificial liner is removed from the first region.

In block 112, a first liner is formed in the openings of the first region. If the first liner is employed for NFETs, the first liner may include Ti or TiN. In block 114, first contacts are formed in the first region on the first liner. In block 116, the first region is blocked with a second mask to remove the sacrificial material from the second region. In block 118, the second mask is removed from the first region, and the sacrificial liner is removed from the second region. In block 120, a second liner is formed in the openings of the second region. If the second liner is employed for PFETs, the second liner may include Pt, Ni or a combination thereof. In block 122, second contacts are formed in the second region. The first contacts and the second contacts may include the same or different materials. The self-aligned contact openings include only one liner in the first region and only one liner in the second region, and the first liner and the second liner include different materials. In one embodiment, the first liner and the second liner form silicides with underlying regions. In block 124, processing continues to complete the device.

Having described preferred embodiments for a dual silicide liner flow for enabling low contact resistance (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

The invention claimed is:

1. A method for fabricating a semiconductor device, comprising:
depositing a sacrificial liner in self-aligned contact openings in first and second regions, where the first region includes a first device type and the second region includes a second device type;
filling the self-aligned contact openings of the first and second regions with a sacrificial material;
blocking the second region with a first mask to completely remove the sacrificial material from the first region;
removing the first mask from the second region and completely removing the sacrificial liner from the first region;
forming a first liner in the self-aligned contact openings of the first region;
forming first contacts in the first region on the first liner;
blocking the first region with a second mask to remove the sacrificial material from the second region;
removing the second mask from the first region and removing the sacrificial liner from the second region;
forming a second liner in the self-aligned contact openings of the second region; and
forming second contacts in the second region.

2. The method as recited in claim 1, wherein filling the self-aligned contact openings with the sacrificial material includes filling the self-aligned contact openings with TiN.

3. The method as recited in claim 1, wherein depositing the sacrificial liner includes depositing an oxide liner.

4. The method as recited in claim 1, wherein the first region includes an n-type field effect transistor (NFET) region and forming the first liner includes forming the first liner from one of Ti or TiN.

5. The method as recited in claim 1, wherein the second region includes a p-type field effect transistor (PFET) region and forming the second liner includes forming the second liner from one of Pt, Ni or a combination thereof.

6. The method as recited in claim 1, wherein the first contacts and the second contacts include different materials.

7. The method as recited in claim 1, wherein the self-aligned contact openings include only one liner in the first region and only one liner in the second region and the first liner and the second liner include different materials.

8. The method as recited in claim 1, wherein the first liner and the second liner form silicides.

9. A method for fabricating a semiconductor device, comprising:
patterning an interlevel dielectric layer to form self-aligned contact openings over field effect transistors;
depositing a sacrificial liner in the self-aligned contact openings;
filling the self-aligned contact openings with a sacrificial material;
blocking a p-type field effect transistor (PFET) region with a first mask to completely remove the sacrificial material from an n-type field effect transistor (NFET) region;
removing the first mask from the PFET region and completely removing the sacrificial liner from the NFET region;

forming a first liner in the self-aligned contact openings of the NFET region;

forming first contacts in the NFET region on the first liner;

blocking the NFET region with a second mask to remove the sacrificial material from the PFET region;

removing the second mask from the NFET region and removing the sacrificial liner from the PFET region;

forming a second liner in the self-aligned contact openings of the PFET region; and forming second contacts in the PFET region.

10. The method as recited in claim 9, wherein filling the self-aligned contact openings with the sacrificial material includes filling the self-aligned contact openings with TiN.

11. The method as recited in claim 9, wherein depositing the sacrificial liner includes depositing an oxide liner.

12. The method as recited in claim 9, wherein forming the first liner includes forming the first liner from one of Ti or TiN.

13. The method as recited in claim 9, wherein forming the second liner includes forming the second liner from one of Pt, Ni or a combination thereof.

14. The method as recited in claim 9, wherein the first contacts and the second contacts include different materials.

15. The method as recited in claim 9, wherein the self-aligned contact openings include only one liner in the NFET region and only one liner in the PFET region and the first liner and the second liner include different materials.

16. The method as recited in claim 9, wherein the first liner and the second liner form silicides.

\* \* \* \* \*